United States Patent [19]

Gröninger

[11] Patent Number: 4,780,631
[45] Date of Patent: Oct. 25, 1988

[54] DEVICE FOR THE ELECTRONIC CONTROL AND REGULATION OF MACHINES

[75] Inventor: Alois Gröninger, Augsburg, Fed. Rep. of Germany

[73] Assignee: Erhardt & Leimer GmbH, Augsburg, Fed. Rep. of Germany

[21] Appl. No.: 88,466

[22] Filed: Aug. 19, 1987

Related U.S. Application Data

[63] Continuation of Ser. No. 844,465, Mar. 26, 1986, abandoned.

[30] Foreign Application Priority Data

Mar. 26, 1985 [DE] Fed. Rep. of Germany ....... 3510820

[51] Int. Cl.⁴ ............................ G05B 1/06; H05K 1/14
[52] U.S. Cl. ................................ 310/71; 310/DIG. 6; 318/594
[58] Field of Search .......... 310/68 R, 71, 89, DIG. 6; 318/594, 600, 636, 640; 361/415, 413

[56] References Cited

U.S. PATENT DOCUMENTS

| | | | |
|---|---|---|---|
| 4,393,343 | 7/1983 | Angersbach et al. | 318/640 |
| 4,420,793 | 12/1983 | Strandberg | 361/415 |
| 4,584,511 | 4/1986 | Rudich, Jr. et al. | 361/415 |

FOREIGN PATENT DOCUMENTS

| | | | |
|---|---|---|---|
| 1076766 | 3/1960 | Fed. Rep. of Germany | 361/415 |
| 54-23302 | 2/1979 | Japan | 361/415 |
| 594340 | 1/1978 | Switzerland | 361/415 |

*Primary Examiner*—Patrick R. Salce
*Assistant Examiner*—D. L. Rebsch
*Attorney, Agent, or Firm*—Herbert Dubno

[57] ABSTRACT

An electronic control and regulation device for a machine or like apparatus has a plurality of printed circuit boards in a housing, each of the printed circuit boards having interconnected analog and digital circuitry with respective analog and digital terminals. The analog and digital terminals of all of the boards are interconnected respectively by analog and digital conductor bundles, the analog conductor bundle running to the machine or apparatus to be controlled, and serving as well to supply the electric current to the analog part of each printed circuit board.

13 Claims, 2 Drawing Sheets

DEVICE FOR THE ELECTRONIC CONTROL AND REGULATION OF MACHINES

This is a continuation of co-pending application Ser. No. 844,465 filed on Mar. 26, 1986, now abandoned.

FIELD OF THE INVENTION

My present invention relates to a device or apparatus for the electronic control or regulation, i.e. the direction of operations of and the regulation of the speed of, machines and like apparatus utilizing circuits on printed circuit boards. More particularly, the invention relates to machine control systems utilizing both analog and digital electronic circuitry and having a housing in which printed circuit boards carrying such circuitry are mounted.

BACKGROUND OF THE INVENTION

In general, the control and regulation circuitry for machinery, in which such circuitry is provided on printed circuit boards, comprises the usual electronic components on a plurality of such circuit boards in a common housing, the circuit boards having conductive tracks which are applied by a printing operation to make electrical connection among the components in the formation of the circuit carried by each printed circuit board.

The complete printed circuit board, carrying the appropriate elements in their operative interconnection are mounted in a housing which is generally separated from the machine or apparatus to be controlled so that these circuits can be interconnected as required, to provide the desired control and regulation.

In modern high efficiency and high precision control and regulation units, it is common to detect parameters of the machine or apparatus operation in an analog form to convert the analog signals which thus result in digital signals and to process the latter signals digitally, utilizing a microprocessor or microcomputer, for example.

The output digital signals, of course, must be transformed again into analog signals, which after appropriate amplification, if necessary, and modification for control purposes, are applied to the machine or other controlled apparatus to effect a change in the operation thereof, e.g. a change in direction or speed.

It is not uncommon, therefore, for a printed circuit board as used in such applications to carry analog circuitry and the associated electronic components for such circuitry, as well as electronic components for digital signal processing.

At the interfaces between analog and digital parts, analog/digital converters are required.

The digital components of the individual printed circuit boards must be electrically interconnected with one another. Furthermore, connections must be provided for current supply.

The inputs to the analog part of the printed circuit boards are provided with pickups for measured values from the machine or controlled apparatus and the outputs of the analog part which generally applied to electric motors, such as servomotors or other positioning elements, capable of modification of machine operation or changing machine control conditions. For externally measuring and test devices, additional conductors must be provided.

In practice in the machine control environment described above, it has been necessary to provide individual connectors or conductor attachments for each of the conductors or pairs of conductors used for the above-mentioned purposes on the printed circuit board.

Only for the digital part has it been the practice to provide standardized data collection conductors or so-called buses, for connection between a number of printed circuit boards.

The provision of a multiplicity of individually connected conductors to such printed circuit boards is a major problem and, indeed, a major cause of the unreliability of such printed circuit board control systems as have been provided heretofore. Not only does this problem arise because connections may not properly be made, but also because each of the connections is individually sensitive to handling and mechanical strain upon insertion or removal of the printed circuit board. The replacement of a defective printed circuit board is difficult and time-consuming, so that the maintenance of the electronic control and regulation device is difficult.

OBJECTS OF THE INVENTION

It is, therefore, the principal object of the present invention to provide an improved device for the electronic control and regulation of a machine or other controlled apparatus which avoids the aforementioned drawbacks and provides improved control and regulation without sensitivity to mechanical stress upon printed circuit boards of the control system.

Another object of the invention is to provide an electrnic control and regulating device in which the electrical connections to and from the electronic circuit elements on the printed circuit boards can be made rapidly, simply and reliably.

SUMMARY OF THE INVENTION

These objects and others which will become apparent hereinafter are attained, in accordance with the present invention, in a device for the electronic control and regulation of machines and other controlled apparatus in which a plurality of printed circuit boards in a common housing carry the control circuitry.

According to the invention, each of the printed circuit boards is provided with a single analog connector or terminal for the analog part and a single digital connector or terminal for the digital part of the circuit formed on the respective printed circuit board, each of these terminals being of the multicontact type.

According to the invention, moreover, an analog conductor bundle and a digital conductor bundle are provided, the analog conductor bundle being connected to the analog part by the single analog terminal and the digital conductor bundle being connected electrically to the digital part via the digital terminal.

All of the connections to the analog part of the printed circuit board, therefore, are made through the analog conductor bundle which is thereby constituted as an analog bus.

Similarly, the digital conductor bundle can contain all of the necessary conductors for tying together the digital parts of a plurality of printed circuit boards utilizing a digital bus.

The result is a high reliability system which prevents uncontrolled conductor paths or locations which might introduce electrical perturbations in the control system.

The analog and digital terminals, moreover, allow each printed circuit board to be rapidly and simply connected in the system. Similarly, a subsequent replacement of the printed circuit board can be easily undertaken in a unitary packaged electrical connection system of modular construction with high flexibility in setting up the control and regulation system for different requirements of the machine or apparatus. Advantageously, the analog parts of each printed circuit board are supplied by current supply conductors of the respective analog conductor bundle. The integration of the current supply directly into the analog conductor bundle results in a further simplification of the electrical structure in that separate connections for current supply are no longer necessary.

It has been found to be advantageous to supply the digital part of the printed circuit board by current supply conductors of the digital conductor bundle, thereby further reducing or eliminating any need for additional terminals on the printed circuit board.

I have also found it to be advantageous to provide the digital conductor bundle so that it includes at least one data bus by which the digital parts of all of the printed circuit boards can communicate with one another.

In an especially advantageous embodiment of the invention, the analog conductor bundle has at least one signal conductor which transmits measured value signals from the machine or other apparatus to be controlled. The analog conductor bundle can also include a control conductor which delivers analog signals from the analog part of one of the printed circuit boards to the machine or controlled apparatus. Consequently, all of the requisite electrical connections between the machine or controlled apparatus and the control regulating device are integrated in the analog conductor bundle. As a consequence all significant analog signals and voltages can be determined at any point along the analog conductor bundle and can be detected via an analog terminal. At any desired location, for example, and at any printed circuit board, measuring and test devices can be connected or substituted in order to monitor the operation of the system.

Printed circuit boards can be replaced with others having different electronic components, circuitry and operations without rewiring the connections of the machine or controlled apparatus or rewiring the control and regulation system itself.

With the invention, therefore, a simple and highly flexible system for electrical connection of both the analog and the digital parts is provided so that the simplicity and flexibility hitherto associated with digital systems can be seen to apply to the analog components as well.

It has been found to be advantageous to provide the terminals so that they form with the respective conductor bundle mechanically separable plug-and-jack connectors, with one member of each of these connectors and the respective conductor bundle and the other member serving as the analog or digital terminal as described.

It has been found to be advantageous to provide plug bars as the connector members on the back of the housing or on a base conductor board fixed in the housing and forming a back wall of the space in which the printed circuit boards are provided. Preferably such plug connectors are provided in pairs for the digital and analog bundles of a respective printed circuit board, one spaced apart above another. The printed circuit boards can thus form plug cards which are inserted into these connectors. The contacts on the printed circuit board can thus be formed along rear edges thereof. This constitutes a space saving on the printed circuit board.

BRIEF DESCRIPTION OF THE DRAWING

The above and other objects, features and advantages of the present invention will become more readily apparent from the following description, reference being made to the accompanying drawing in which.

SPECIFIC DESCRIPTION

Figure 1:
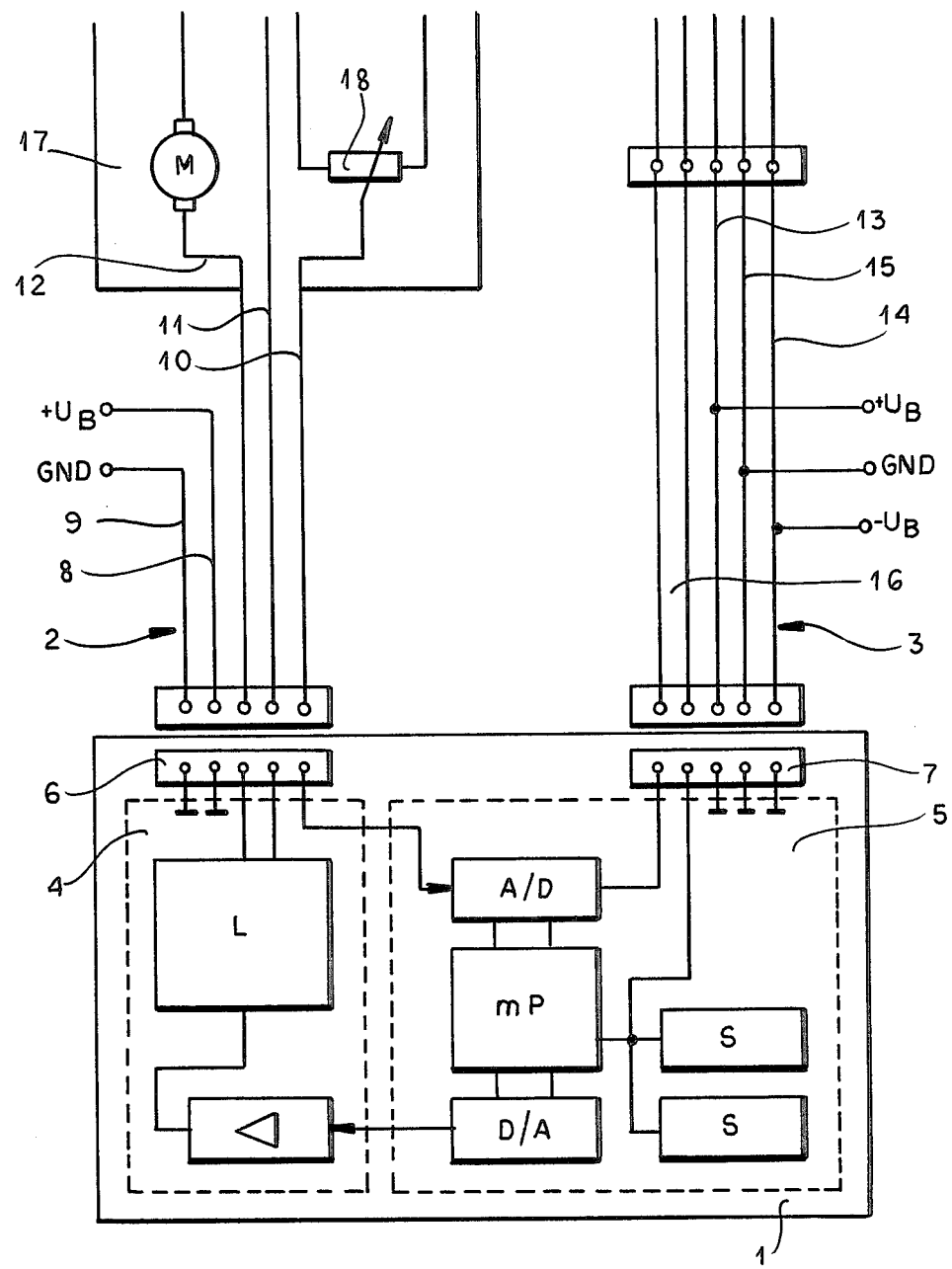
FIG. 1 is a diagram of an electronic control and regulating circuit for a machine illustrated in somewhat simplified form.

The electronic control and regulating device illustrated most generally in FIG. 1 can utilize conventional electronic circuits which therefore are not described in any detail. These circuits are provided on respective printed circuit boards 1 which are mounted in a housing shown only in outline form at H in FIG. 2 and which is remote from the machine or apparatus to be controlled.

The printed circuit board 1 is connected by an analog conductor bundle 2 to the apparatus to be controlled and a current supply source as will be described below, and by a digital conductor bundle 3 to the data bus and other printed circuit boards.

The printed circuit board 1 carries an analog part or analog circuitry 4 including analog circuit elements as well as the circuit elements for digital processing represented by the digital circuitry or digital part 5. The two parts are interconnected on the board to form a unit for control and regulation of the apparatus. The analog part is electrically connected to the analog conductor bundle by the multicontact analog terminal 6.

The digital part 5 is connected to the digital conductor bundle 3 by the digital terminal 7.

The analog conductor bundle 2 contains a current supply conductor 8, a ground or common conductor 9, a signal conductor 10 delivering measured value signals to the circuitry and two control conductors 11 and 12 which delivery output signals to the controlled apparatus to regulate same.

The digital conductor bundle 3 has two current supply conductors 13 and 14, a common or ground conductor 15 and two further parallel conductors forming a data bus 16.

In FIG. 1, the machine or apparatus to be controlled has been represented at 17 and is connected by the signal conductor 10 and the two control conductors 11 and 12 to the analog terminal 6 of the printed circuit board 1.

The actual value sensor 18, which can be any transducer responsive to a condition of the machine, supplies an analog signal to the analog terminal 6 representing a machine condition to be monitored and to be utilized by comparison with a set-point value, for example, for control purposes in a feedback path.

On the printed circuit board 1, this signal is applied to an analog/digital converter A/D which outputs digital signals representing the actual value signal. These digital signals are then processed by a microprocesser mP which is connected to a digital/analog converter D/A and to the data bus 16. The feedback output from the digital/analog converter is applied to an amplifier and then to the board control circuitry L of the machine to regulate operation thereof, the control signals being delivered through the terminal 6 to the analog conductor bundle.

The digital signals of the microprocessor are applied as well to two memories S which can be random access memories set via the data bus from some remote location or in accordance with data from another printed circuit board, or programmable read-only memories assigned to the particular printed circuit board or simple read-only memories assigned to a specific control function and establishing a fixed setpoint value. The analog output signal can be applied to a servomotor M which is therefore controlled in response to the actual value and signal generated by element 18.

Thus all of the analog signals and voltages for control and regulation of the machine 17 can be found at the analog terminal 6.

Via the analog conductor bundle 2 and the digital conductor bundle 3, the printed circuit board 1 can be connected to other, similar or identical printed circuit boards, serving for backup or other control tasks, in the housing H.

Figure 2:
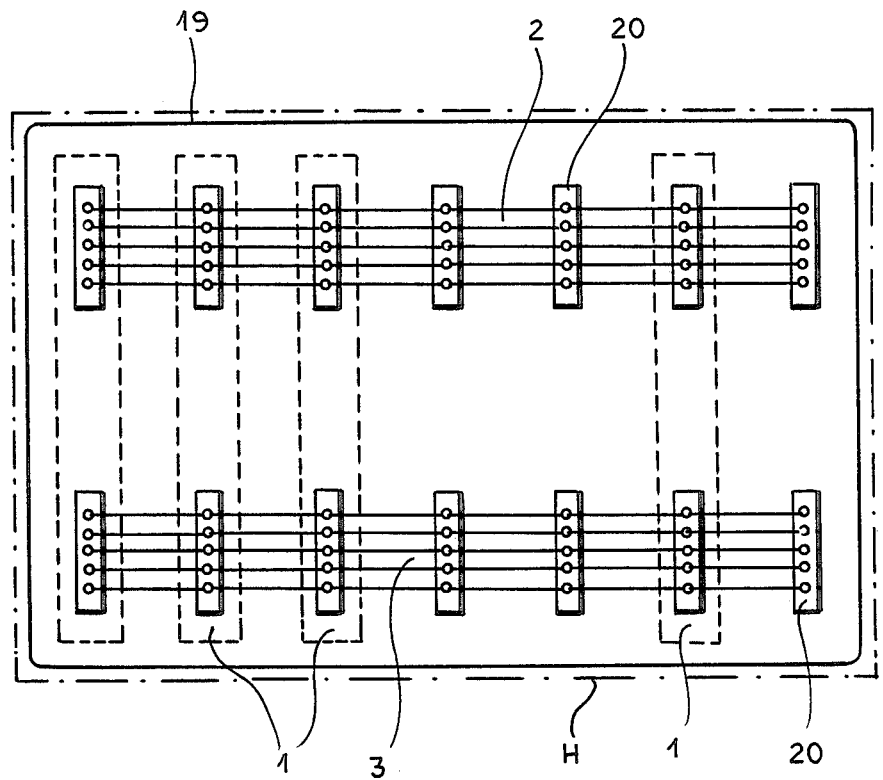
FIG. 2 is an elevational view diagrammatically illustrating the layout of connectors of a housing in which a multiplicity of the printed circuit boards of FIG. 1 can be inserted for such device.

The latter, as can be seen from FIG. 2, has a base conductor plate 19 or a rear wall of the housing in which plug bars 20 are mounted in pairs, one above another, each plug pair receiving the terminal 6, 7 of a printed circuit board 1 forming a card insertable into the plug pair. The plug pairs are spaced apart so that the printed circuit boards can be similarly spaced.

The terminals 6 and 7 can have contacts formed along a rear edge of the board for insertion into the contact strips 20.

I claim:

1. A device for electronic control and regulation of a machine or like apparatus, comprising:
   (A) a housing;
   (B) a plurality of printed circuit boards in said housing each formed with:
      (a) an analog part comprising analog circuit elements forming analog circuitry having an output and an input,
      (b) a digital part separate from the analog part and comprising digital circuit elements froming digital circuitry having an input and output, said analog and digital circuitry being interconnected only at the inputs and outputs on the board to form a respective unit for control and regulation of said apparatus
      (c) a multicontact analog terminal on said printed circuit board having contacts connected only to the respective analog circuitry, and
      (d) a multicontact digital terminal on said printed circuit board having contacts connected only to the respective digital circuitry;
   (C) an analog conductor bundle
      (a) connected to said apparatus,
      (b) carrying a plurality of respective analog connectors,
      (c) having a plurality of conductors detachably connected via the respective connectors to said analog parts by the respective contacts of the respective multicontact analog terminals; and
      (d) including a power supply conductor for energizing only said analog circuit elements; and
   (D) a digital conductor bundle
      (a) formed with a data bus,
      (b) carrying a plurality of respective digital connectors each associated with a respective analog connector and board,
      (c) having a plurality of conductors separate from the analog bundle and detachably connected via the respective digital connectors to said digital parts by the respective contacts of the respective multicontact digital terminals, and
      (d) including a power supply conductor for energizing only said digital circuit elements.

2. The device defined in claim 1, wherein the analog conductor bundle includes at least on signalling conductor carrying a measured-value signal from the machine or apparatus to be controlled.

3. The device defined in claim 1 wherein the analog conductor bundle includes at least one control conductor connected by said analog terminal to the output of said analog part.

4. The device defined in claim 1 wherein the analog terminal and the digital terminal are each formed by one member of a respective plug-and-jack connector, another member of the respective plug-and-jack connector being provided on the respective conductor bundle.

5. The device defined in claim 4 wherein said members of said connectors are provided in pairs on a back of said housing or on its base circuit board and in a mating pair on each said printed circuit board whereby said printed circuit board can be plugged into a selected pair of said members on said housing.

6. The device defined in claim 5 the members of said connectors on the back of said housing or on its base circuit board are provided one above another for each pair.

7. A device for the control of machinery, comprising:
   a housing formed with two rows of spaced apart mutually parallel connectors, a plurality of bus conductors connecting corresponding terminals of the bus connectors of one of said rows to form a multiconductor analog bus and a plurality of conductors connecting corresponding terminals of the connectors of the other of said rows to form a multiconductor digital bus, said buses being transversely separated and each bus connector of one of said rows being transversely aligned with a respective bus connector of the other of said rows: and
   a plurality of printed circuit boards replaceable mounted in said housing, each of said board being rectangular and having along a common edge, an analog board connector spaced from a digital board connector, the analog and digital board connectors of each board being matingly engaged respectively in a plug-and-socket relationship with one of said bus connectors of said one of said rows and a respective bus connector aligned therewith of the other row, said printed circuit boards each having an analog portion with interconnected analog circuit elements connected to the respective analog board connector, and a digital portion spatially separated from said analog portion and formed with electrically interconnected digital-information-processing digital circuit elements connected to the respective digital board connector, and conductor means on each printed circuit board accessing the analog bus from the respective digital circuit elements through the respective analog board connector.

8. In a device for the control of machinery which comprises:
   a plurality of printed circuit boards each having an analog part provided with interconnected analog circuit elements and a digital part spatially separate from the analog part and provided with digital circuit elements interconnected for digital data processing;

a housing provided with a base plate onto which said printed circuit boards are replaceably plugged, said base plate having means forming a multiconductor digital bus interconnecting all of said digital parts of said printed circuit boards; and connectors on said boards and on said base plate, each of said boards being provided with spatially separated connectors respectively forming an analog connector connected to the respective analog part and a digital connector connected to the respective digital part, the improvement which comprises:

a multiconductor analog bus formed on said base plate, spatially separated from said digital bus, and interconnecting all of said analog parts through said analog connectors; and Conductor means on each of said printed circuit boards electrically connecting the respective digital part to said analog bus through the respective analog connector of the respective printed circuit board.

9. The improvement defined in claim 8 wherein said analog bus includes at least one conductor carrying a measured value signal from at least one machine controlled by a respective one of said printed circuit boards.

10. The improvement defined in claim 9 wherein said analog bus includes at least one conductor carrying machine-control commands.

11. The improvement defined in claim 10 wherein the connectors on said plate and said printed circuit boards are mechanically releasable connectors.

12. The improvement defined in claim 11 wherein said mechanically releasable connectors are plug-and-socket connectors.

13. The improvement defined in claim 12 wherein said analog bus is provided with conductors supplying electrical power to the circuit elements of all of said analog parts and said digital bus is provided with conductors supplying electrical power to the circuit elements of all of said digital parts.

* * * * *